United States Patent [19]
Rogers

[11] Patent Number: 5,874,804
[45] Date of Patent: Feb. 23, 1999

[54] ORGANIC ELECTROLUMINESCENT DEVICE HERMETIC ENCAPSULATION PACKAGE AND METHOD OF FABRICATION

[75] Inventor: Stephen P. Rogers, Phoenix, Ariz.

[73] Assignee: Motorola, Inc., Schaumburg, Ill.

[21] Appl. No.: 807,974

[22] Filed: Mar. 3, 1997

[51] Int. Cl.⁶ .................................................. H05B 33/04
[52] U.S. Cl. ........................... 313/512; 313/504; 313/506
[58] Field of Search ..................................... 313/506, 512, 313/504

[56] References Cited

U.S. PATENT DOCUMENTS

| | | |
|---|---|---|
| 4,829,213 | 5/1989 | Pecile et al. ............................ 313/512 |
| 5,124,204 | 6/1992 | Yamashita et al. ...................... 313/512 |
| 5,189,405 | 2/1993 | Yamashita et al. ...................... 313/512 |
| 5,239,228 | 8/1993 | Taniguchi et al. ....................... 313/512 |
| 5,632,663 | 5/1997 | Ishihara et al. .......................... 313/512 |

*Primary Examiner*—Nimeshkumar D. Patel
*Attorney, Agent, or Firm*—Eugene A. Parsons; William E. Koch

[57] ABSTRACT

An organic electroluminescent device encapsulating package including a substrate, an organic electroluminescent device carried by the substrate, an inorganic perimetric seal carried by the substrate, the perimetric seal encircling the organic electroluminescent device within a perimeter thereof, and an inorganic cover overlying the organic electroluminescent device and sealingly coupled to the substrate in a spaced apart relationship by the inorganic perimetric seal.

11 Claims, 1 Drawing Sheet

ORGANIC ELECTROLUMINESCENT DEVICE HERMETIC ENCAPSULATION PACKAGE AND METHOD OF FABRICATION

FIELD OF THE INVENTION

The present invention pertains to organic electroluminescent devices and more specifically to hermetic encapsulation of organic electroluminescent devices.

BACKGROUND OF THE INVENTION

Organic electroluminescent devices (OEDs), and especially organic light emitting diodes (LEDs) and the like, generally utilize a layer of reactive metal in the cathode to ensure efficient injection of electrons and low operating voltages. However, reactive metals are particularly susceptible to damage due to oxidation in the presence of oxygen and moisture. Oxidation of the metal severely limits the lifetime of a device. A hermetic seal is normally required to achieve long term stability and longevity. For example, the time to half the luminance intensity under constant current condition for an unencapsulated device versus an encapsulated device is 200 hours as opposed to 1000 hours. Also, the rate of dark spot growth is significantly reduced for encapsulated devices.

Several approaches to protecting or encapsulating OEDs have been reported. In a prior art (JP 91359134), a glass cover was directly adhered to the OED active area and device substrate with a photo curing resin layer. Another prior art (U.S. Pat. No. 5,189,405), used a series of sheets inside a cover laminate consisting of a metallic foil between two organic resin films adhered to the OED glass substrate using an epoxy resin. Typically, a low temperature, thermally cured organic epoxy material is used to create the perimeter seal or barrier and adhere the cover to the device substrate, and is usually accomplished by curing the organic epoxy at 85 degrees Celsius over a two hour period. Furthermore, the permeation rate of oxygen and water through organic barriers is several orders of magnitude greater than through inorganic barriers. Thus, the organic epoxy provides a path for the ingress of oxygen and water. A further problem is a result of the fact that the organic layers, particularly the hole transport materials are sensitive to temperatures as related to their property of glass transition. The glass transition is best described as a molten solid, and for many organic materials occurs at relatively low temperatures, such as below 100 degrees Celsius. The potential for the organic material to crystallize is greater once the glass transition has been reached. Crystallization of an organic film in the fabrication of an OED leads to low charge mobility, charge traps, pinholes and shorts. In many instances, even approaching the critical temperatures of the organic layers, especially if the elevated temperatures are maintained for relatively long periods of time, can degrade the organic material and reduce the reliability and/or the longevity of the device.

Several integrated approaches have also been developed. The integrated approaches typically include a protection layer deposited on the discrete device as part of the fabrication process. The integrated encapsulation schemes require specialized processing equipment and techniques.

Accordingly, it is highly desirable to devise a relatively inexpensive and convenient encapsulation package for hermetically sealing organic electroluminescent devices.

It is a purpose of the present invention to provide a new and improved encapsulation package for organic electroluminescent devices.

It is another purpose of the present invention to provide a new and improved encapsulation package for organic electroluminescent devices which has a thin profile and is light in weight.

It is a further purpose of the present invention to provide an encapsulation package for organic electroluminescent devices which acts as an effective barrier to oxygen and moisture.

SUMMARY OF THE INVENTION

Briefly, to achieve the desired objects of the instant invention in accordance with a preferred embodiment thereof, provided is an organic electroluminescent device encapsulating package including a substrate, an organic electroluminescent device carried by the substrate, an inorganic perimetric seal carried by the substrate, the perimetric seal encircling the organic electroluminescent device within a perimeter thereof, and an inorganic cover overlying the organic electroluminescent device and sealingly coupled to the substrate in a spaced apart relationship by the inorganic perimetric seal.

Also provided is a method of fabricating an organic electroluminescent device encapsulating package.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
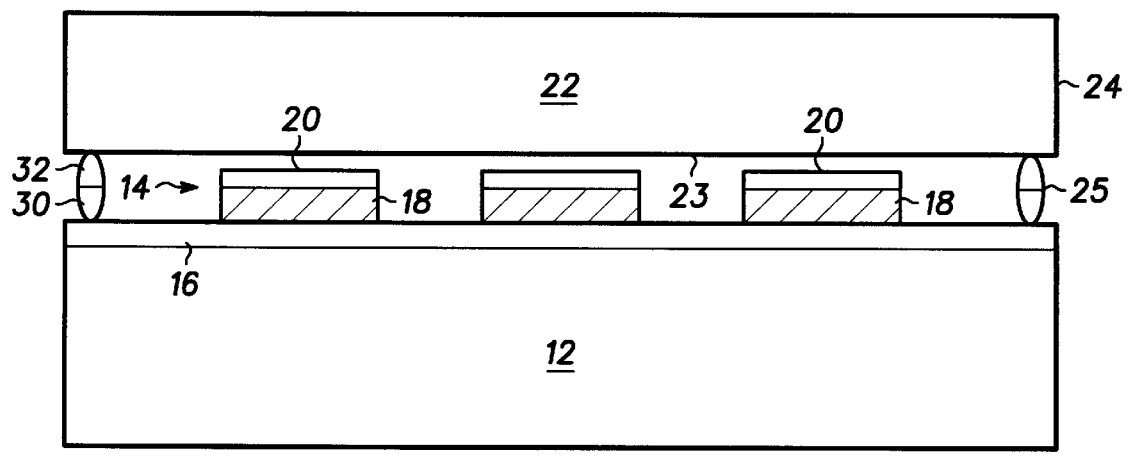
FIG. 1 is a simplified cross-sectional view of an organic electroluminescent device encapsulation package.

Turning to the drawings in which like reference characters indicate corresponding elements through out the several views, attention is first directed to FIG. 1 which illustrates a simplified cross-sectional view of a hermetically sealed encapsulation package 10, in accordance with the present invention. Package 10 includes a supporting substrate 12 which is some optically clear material, such as glass, quartz, a transparent semiconductor material or the like, etc. An organic electroluminescent device 14 is positioned on substrate 12, generally by fabricating device 14 directly on substrate 12 in any of the various methods of fabricating organic electroluminescent devices.

As a specific example, device 14 includes a transparent first electrical contact layer 16 of conductive material, such as indium-tin-oxide (ITO) or the like, with an active organic layer 18, typically composed of a laminant of several organic layers which function to inject holes and electrons from opposite contacts, transport holes and electrons, and form a recombinant or electroluminescent zone to form the organic electroluminescent device, positioned thereon and a second electrical contact 20 formed of a metal layer including a thin layer of a reactive metal. As previously stated, device 14, and especially the layer of reactive metal, is susceptible to oxygen and moisture in the surrounding atmosphere and must, therefore, be protected to provide reliability and a reasonable operating longevity.

Protection is provided in the form of an inorganic cover 22 having an inner surface 23 and an edge 24. Inorganic cover 22 is formed of an electrically insulating inorganic material, preferably glass, quartz, or semiconductor material, as oxygen and water permeate inorganic materials at a rate which is orders of magnitude less than the rate at which oxygen and water permeate organic materials such as thin plastic films. The use of glass, quartz or thin silicon provides an inexpensive material having light weight and low profile.

Inorganic cover 22 overlies organic electroluminescent device 14 and is sealingly coupled to the substrate in a spaced apart relationship by a perimetric seal 25. Perimetric seal 25 completely encircles organic electroluminescent device 14 or a multiplicity of organic electroluminescent devices 14 in an array within a perimeter thereof, providing a hermetic seal between cover 22 and substrate 12. Perimetric seal 25 is formed of inorganic materials, as oxygen and water permeate inorganic material at a rate which is orders of magnitude less than the rate at which oxygen and water permeate organic materials such as the epoxies typically used in bonding.

Figure 2:
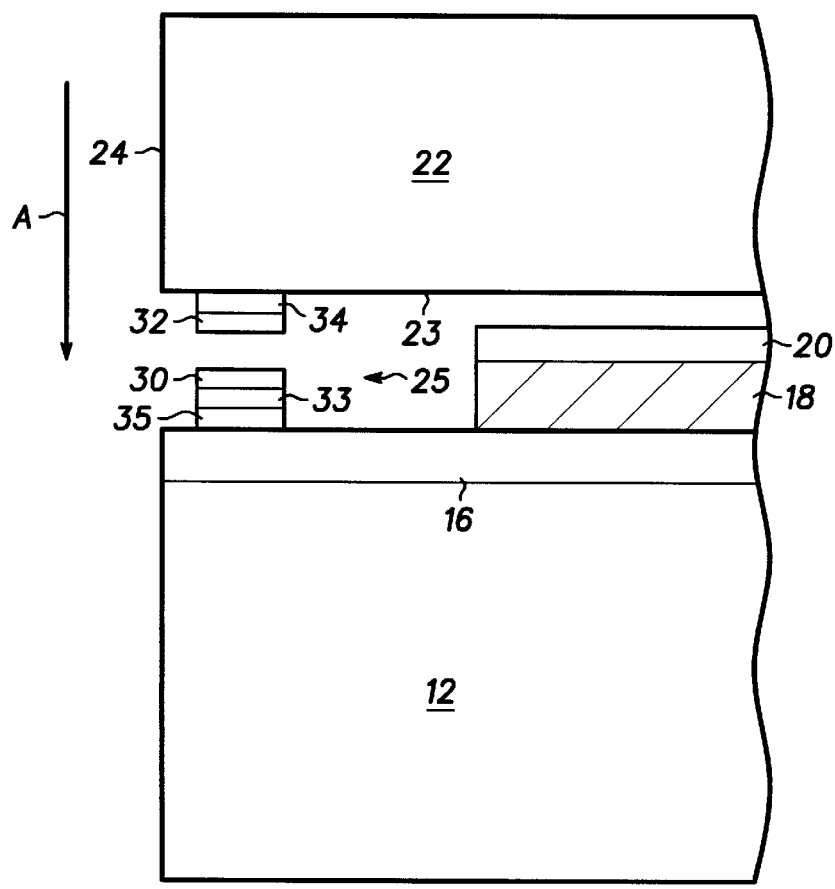
FIG. 2 is a partial sectional side view of the organic electroluminescent device of FIG. 1, illustrating the perimetric seal and placement of the cover.

With additional reference to FIG. 2, the process of encapsulation includes creating inorganic perimetric seal 25 between substrate 12 and inorganic cover 22. Inorganic perimetric seal 25 is created by forming a first layer 30 of low melting metal on substrate 12 and forming a second layer 32 of low melting metal on inner surface 23 of cover 22 proximate edge 24. Cover 22 is then positioned overlying organic electroluminescent device 14 with second layer 32 overlying first layer 30 and moved into contact in a direction illustrated by arrowed line A. Inorganic perimetric seal 25 is created by reflowing first layer 30 and second layer 32 in an inert and dry environment. Reflow of first layer 30 and second layer 32 can be accomplished in a variety of manners, but is preferably accomplished by using pressure and a heating element having the same pattern as inorganic perimetric seal 25. The temperature for the reflow process is confined to the proximity of inorganic perimetric seal 25 and the time for the reflow process is significantly less than the time required to thermally cure the conventional epoxy due to low temperature alloying or diffusion bonding created by the pressure sealing process. Thus, the exposure of the temperature sensitive organic material to heat is significantly reduced.

Still referring to FIG. 2, perimetric seal 25 further includes a first adhesion layer 33 coupling first layer 30 to substrate 12 and a second adhesion layer 34 coupling second layer 32 to cover 22. In the preferred embodiment, first layer 30 and second layer 32-are formed of indium. However, indium does not adhere well to the materials of substrate 12 and cover 22. Therefore, adhesion layers 33 and 34, formed of titanium, are employed. It will be understood that other materials can be used, specifically, tin and indium or gold and indium material systems may be employed whereby first layer 30 is formed of tin or gold and second layer 32 is formed of indium. Alternatively, first layer 30 is formed of indium and second layer 32 is formed of tin or gold. Including indium in first layer 30 and gold in second layer 32, for example, allows a satisfactory joining or amalgamation by the application of a relatively light pressure therebetween.

As can be seen in FIGS. 1 and 2, first adhesion layer 33 and first layer 30 are formed overlying first contact 16 patterned on substrate 12. In this manner, electrical contact outside package 10 can be accomplished. However, a short will develop if perimeter seal 25 directly contacts electrical contact 16. Therefore, in addition, in this specific embodiment, an electrically insulating layer 35 of dielectric material such as a PECVD nitride or oxide is deposited between first adhesion layer 33 and substrate 12, insulating electrical contact 16 from first adhesion layer 33, first layer 30 and second layer 32.

Thus, a relatively inexpensive and convenient encapsulation package for hermetically sealing organic electroluminescent devices has been provided. The encapsulation package for organic electroluminescent devices has a thin profile, is light in weight, and provides an effective barrier to oxygen and moisture.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. An organic electroluminescent device encapsulating package comprising:

a substrate;

an organic electroluminescent device carried by the substrate;

an inorganic perimetric seal carried by the substrate, the perimetric seal encircling the organic electroluminescent device within a perimeter thereof; and an inorganic cover overlying the organic electroluminescent device and sealingly coupled to the substrate in a spaced apart relationship by the inorganic perimetric seal, and the inorganic perimetric seal including a first layer of low melting metal patterned on the substrate and a second layer of low melting metal patterned on the cover, the first layer and the second layer joined by reflow of the low melting metal.

2. An organic electroluminescent device encapsulation package as claimed in claim 1 wherein the perimetric seal further includes a first adhesion layer coupling the first layer to the substrate and a second adhesion layer coupling the second layer to the cover.

3. An organic electroluminescent device encapsulation package as claimed in claim 1 wherein the cover and the substrate include contacts electrically coupled to the organic electroluminescent device.

4. An organic electroluminescent device encapsulation package as claimed in claim 1 wherein the organic electroluminescent device includes a first electrical contact layer formed on the substrate and an organic layer overlying the first electrical contact layer and carried by the substrate, the perimetric seal overlying the first electrical contact layer and carried by the substrate.

5. An organic electroluminescent device encapsulation package as claimed in claim 4 wherein the organic electroluminescent device further includes a second electrical contact layer overlying the organic layer and the first electrical contact layer.

6. An organic electroluminescent device encapsulation package as claimed in claim 5 wherein the perimetric seal has a thickness substantially equal to the thickness of the organic layer such that the first electrical contact layer and the second electrical contact layer are spaced apart sufficient to accommodate the organic layer while maintaining contact therewith.

7. An organic electroluminescent device encapsulating package comprising:

a substrate;

a first electrical contact layer formed on the substrate;

an organic layer overlying the first electrical contact layer and carried by the substrate;

a perimetric seal overlying the first electrical contact layer and carried by the substrate, the perimetric seal enclosing the organic layer within a perimeter thereof;

a second electrical contact layer overlying the organic layer and the first electrical contact layer, the perimetric seal has a thickness substantially equal to the thickness of the organic layer such that the first electrical contact layer and the second electrical contact layer are spaced apart sufficient to accommodate the organic layer while maintaining contact therewith; and an inorganic cover overlying the second electrical contact layer, the organic layer and the first electrical contact layer, the inorganic cover is carried by the substrate and supported in a spaced apart relationship therefrom and sealed thereto by the perimetric seal, and the perimetric seal including a first layer of a first metal patterned on the substrate overlying the first electrical contact layer and a second layer of a second metal patterned on the cover, the first layer and the second layer being joined by pressure to form the perimetric seal.

8. An organic electroluminescent device encapsulating package as claimed in claim 7 wherein the first metal includes one of indium and gold and the second metal includes another of indium and gold.

9. An organic electroluminescent device encapsulation package comprising a substrate;

a first electrical contact layer formed on the substrate;

an organic layer overlying the first electrical contact layer and carried by the substrate;

a perimetric seal overlying the first electrical contact layer and carried by the substrate, the perimetric seal enclosing the organic layer within a perimeter thereof;

a second electrical contact layer overlying the organic layer and the first electrical contact layer, the perimetric seal has a thickness substantially equal to the thickness of the organic layer such that the first electrical contact layer and the second electrical contact layer are spaced apart sufficient to accommodate the organic layer while maintaining contact therewith; and an inorganic cover overlying the second electrical contact layer, the organic layer and the first electrical contact layer, the inorganic cover is carried by the substrate and supported in a spaced apart relationship therefrom and sealed thereto by the perimetric seal, wherein the perimetric seal includes a first layer of low melting metal patterned on the substrate overlying the first electrical contact layer and a second layer of low melting metal patterned on the cover, the first layer and the second layer being joined by reflow of the low melting metal.

10. An organic electroluminescent device encapsulation package as claimed in claim 9 wherein the perimetric seal further includes a first adhesion layer coupling the first layer to the substrate and a second adhesion layer coupling the second layer to the cover.

11. An organic electroluminescent device encapsulation package as claimed in claim 10 wherein the adhesion layer includes titanium, and the perimetric seal includes indium.

* * * * *